(12) United States Patent
Gardner et al.

(10) Patent No.: US 6,172,402 B1
(45) Date of Patent: *Jan. 9, 2001

(54) INTEGRATED CIRCUIT HAVING TRANSISTORS THAT INCLUDE INSULATIVE PUNCHTHROUGH REGIONS AND METHOD OF FORMATION

(75) Inventors: Mark I. Gardner; Mark C. Gilmer, both of Cedar Creek; Daniel Kadosh, Austin, all of TX (US)

(73) Assignee: Advanced Micro Devices, Sunnyvale, CA (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/090,466

(22) Filed: Jun. 4, 1998

(51) Int. Cl.[7] .................................................. H01L 27/01
(52) U.S. Cl. .......................... 257/347; 257/487; 257/497; 257/506
(58) Field of Search ..................................... 257/347, 349, 257/351, 487, 497, 506, 510, 513

(56) References Cited

U.S. PATENT DOCUMENTS

| | | | |
|---|---|---|---|
| 3,356,858 | * 12/1967 | Wanlass | 257/369 |
| 3,821,781 | * 6/1974 | Chang et al. | 257/369 |
| 4,700,454 | * 10/1987 | Baerg et al. | 257/374 |
| 5,510,640 | * 4/1996 | Shindo | 257/347 |
| 5,641,980 | * 6/1997 | Yamaguchi et al. | 257/347 |
| 5,656,845 | * 8/1997 | Akbar | 257/347 |
| 5,712,173 | * 1/1998 | Liu et al. | 438/297 |
| 5,905,286 | * 5/1999 | Iwamatsu et al. | 257/347 |
| 5,930,642 | * 7/1999 | Moore et al. | 257/347 |

* cited by examiner

*Primary Examiner*—J. Carroll
(74) *Attorney, Agent, or Firm*—Bruce Garlick; James Harrison

(57) ABSTRACT

An integrated circuit includes a plurality of transistors formed to include insulative punchthrough regions. Each of the plurality of transistors includes a channel formed upon a substrate, an insulative punchthrough region formed below the channel, a source formed upon the insulative punchthrough region residing adjacent a first end of the channel, a drain formed upon the insulative punchthrough region residing adjacent a second end of the channel, a gate oxide formed above the channel and a gate conductor formed above the gate oxide. Isolation regions may also be formed in the substrate that have an etch stop defination that was formed upon formation of the insulative punchthrough region. A voltage threshold region may be formed between the gate oxide and the channel and lightly doped regions may be formed adjacent the channel. The insulative punchthrough region may be and oxide layer formed within the substrate in an oxygen implant step that also formed the etch stop defination. The transistors and other circuit elements formed in the substrate may be interconnected to form an integrated circuit.

16 Claims, 7 Drawing Sheets

INTEGRATED CIRCUIT HAVING TRANSISTORS THAT INCLUDE INSULATIVE PUNCHTHROUGH REGIONS AND METHOD OF FORMATION

PRIORITY CLAIM TO RELATED APPLICATION

The present application claims priority pursuant to 35 U.S.C. Sec. 120 to U.S. Pat. No. 5,930,642, issued Jul. 27, 1999, filed on Jun. 9, 1997 as U.S. Regular Application Ser. No. 08/871,468.

BACKGROUND

1. Field of the Invention

The present invention relates generally to integrated circuit manufacture; and more particularly to an integrated circuit that includes a plurality of devices having insulative punchthrough regions

2. Description of the Related Art

The structure and the various components, or features, of a metal oxide semiconductor (MOS) device are generally well known. A MOS transistor typically includes a substrate material onto which a gate insulator and a patterned gate conductor are formed. The gate conductor serves to self-align impurities forwarded into the substrate on opposite sides of the gate conductor. The impurities placed into the substrate define a junction region, also known as source/drain regions. The gate conductor is patterned from a layer of polysilicon using various lithography techniques.

A typical n-channel MOS transistor employs n-type junctions placed into a p-type substrate. Conversely, a typical p-channel MOS transistor comprises p-type junctions placed into an n-type substrate. The substrate comprises an entire monolithic silicon wafer, of which, a portion of the substrate known as a "well" exists. The well is doped opposite the substrate so that it can accommodate junctions of an impurity type opposite the junction in the non-well areas. Accordingly, wells are often employed when both n-type and p-type transistors (i.e. Complementary MOS, "CMOS") are needed.

A pervasive trend in modern integrated circuit manufacture is to produce transistors having feature sizes as small as possible. To achieve a high density integrated circuit, features such as the gate conductor, source/drain junctions, and interconnects to the junction must be made as small as possible. Many modern day processes employ features which have less than 0.15 micron critical dimensions. As feature size decreases, the resulting transistor as well as the interconnect between transistors also decreases. Smaller transistors allow more transistors to be placed on a single monolithic substrate, thereby allowing relatively large circuit systems to be incorporated on a single and relatively small die area. Further, smaller transistors typically have lower turn-on threshold voltages, faster switching speeds and consume less power in their operation. These features in combination allow for higher speed integrated circuits to be constructed that have greater processing capabilities.

The benefits of high density circuits can only be realized if advanced processing techniques are used. For example, semiconductor process engineers and researchers often study the benefits of electron beam lithography and x-ray lithography to achieve the higher resolutions needed for submicron features. To some extent, wet etch has given way to a more advanced anisotropic (dry etch) technique. Further, silicides and polycides have replaced higher resistivity contact structures mostly due to the lower resistivity needed when a smaller contact area is encountered.

Many other techniques are often used to achieve a higher density circuit. However, these techniques must contend with problems resulting from higher density itself. Even the most advanced processing techniques cannot in all instances offset the problems associated with small features or features arranged extremely close to one another. For example, as the channel length decreases, short channel effects ("SCE") generally occur. SCE cause threshold voltage skews at the channel edges as well as excessive subthreshold currents (e.g., punch through and drain-induced barrier lowering). Related to SCE is the problem of hot carrier injection ("HCI"). As the channel shortens and the supply voltage remains constant, the electric field across the drain-to-channel junction becomes excessive. Excessive electric fields give rise to so called hot carriers and the injection of these carriers into the gate oxide which resides between the substrate (or well) and the overlying gate conductor. Injection of hot carriers should be avoided since these carriers can become trapped and skew the turn-on threshold voltage of the ensuing transistor.

In attempt to provide a design turn-on threshold voltage, the doping of channel regions of the transistors are enhanced at a surface region ($V_T$ region) of the channel. Further, to isolate the channel regions of the transistors from the substrate (or well), a punchthrough region is formed between the channel region and the substrate (or well). The punchthrough region aids in inverting the channel during turn-on by preventing leakage into the substrate. In forming the punchthrough region, a portion of the substrate (or well) adjacent the channel region is doped. For example, in an n-type transistor, the punchthrough region would be doped p-type using a Boron implant technique, for example. Likewise, in a p-type transistor, the punchthrough region is doped n-type using a Phosphorous implant technique, for example.

With a decrease in the dimensions of the transistor, however, the depth of the channel region is also decreased. With the decrease in depth of the channel region, the punchthrough region resides relatively closer to the $V_T$ region of the transistor. Since these regions are typically oppositely doped, migration of charges between the $V_T$ region and the punchthrough region becomes likely, causing the turn-on threshold voltage to be undesirably altered. Further, the doped punchthrough region causes the channel to be pinched, lowering the available source to drain current ($I_{DS}$) provided by the transistor. The lowering of the $I_{DS}$ may prevent the integrated circuit within which the transistor is formed from operating as designed, at worst, and may cause the integrated circuit to be operable at a relatively lower speed.

Thus, there exists a need in the art for an improved transistor construction that overcomes the shortcomings caused by conventional punchthrough formation.

SUMMARY OF THE INVENTION

The problems outlined above are in large part solved by transistors formed according to the present invention that include channel regions bounded by an insulative punchthrough region and a gate oxide. A voltage threshold ($V_T$) may be formed adjacent the gate oxide in a portion of the channel to regulate turn-on voltage. With the channel bounded by the insulative punchthrough region, as compared to prior punchthrough region formation techniques, charge migration from the well or substrate to the channel is substantially reduced or eliminated. Further, because the punchthrough region is insulative, it contains no doping that could migrate into the channel. The channel region and $V_T$ are enabled, therefore, to operate as designed and to provide the designed turn-on voltage and designed drain to source current ($I_{DS}$)

The insulative punchthrough region may be formed in an ion implant step in which oxygen or another suitable insulator is implanted into the surface of substrate at an appropriate depth. Once the insulative punchthrough region has been formed, transistors and other circuit elements may be formed upon the substrate using techniques that are generally known. Once the transistors are fully formed, they may be interconnected to form an integrated circuit using additional known techniques. Integrated circuits formed according to the present invention may include microprocessors, micro-controllers, digital signal processors, signal conversion circuitry, application specific integrated circuits and microprocessor companion chip sets, for example.

According to the present invention, an etch stop defination in isolation regions may be formed during a process step that forms the insulative punchthrough regions. In such formation, active regions of the substrate are selective masked such that the insulative punchthrough regions will be formed at the design substrate depth at a design density. Further, isolation regions remain exposed during such formation so that the process step forms the etch stop defination in the exposed areas. This etch stop defination defines a depth of isolation regions to which subsequent etching steps will stop. The isolation openings formed will then be filled with an appropriate insulating material to form the isolation structures.

Moreover, other aspects of the present invention will become apparent with further reference to the drawings and specification which follow.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF THE DRAWINGS

Figure 1:
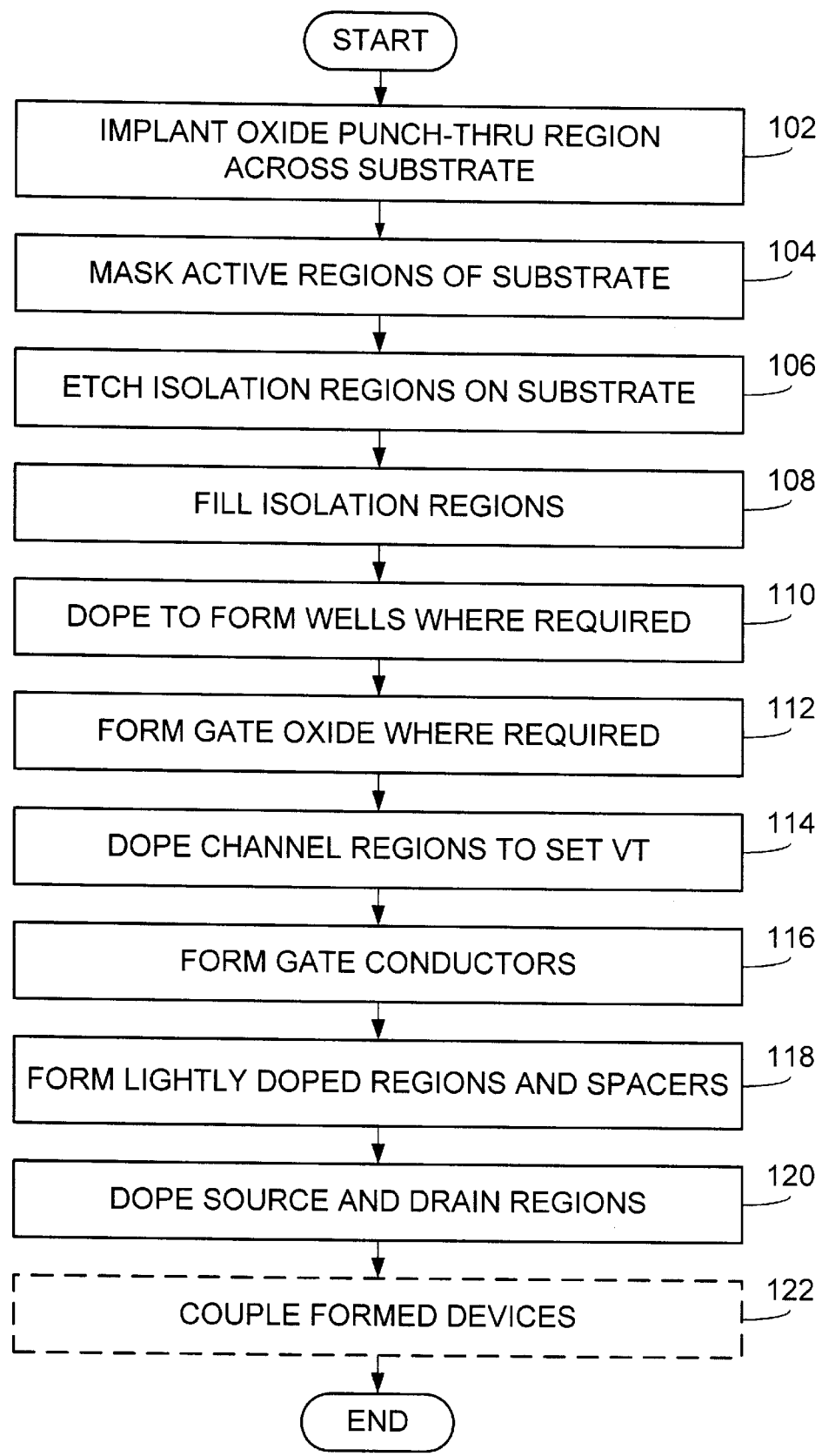
FIG. 1 is a logic diagram illustrating a method for making an integrated circuit having a plurality of transistors formed according to the present invention, the plurality of transistors including insulative punchthrough regions.

FIG. 1 illustrates a method for forming an integrated circuit according to the present invention including forming a plurality of transistors having insulative punchthrough regions. The method of the present invention is described generally with reference to FIG. 1 and will be subsequently described in detail as applied to the formation of transistors and an integrated circuit with particular reference to FIGS. 2A through 2D and 3A through 3D. References made to the term "insulative" when describing the insulative punchthrough regions refers to the insulating properties of the substrate material that has been altered in form to created the punchthrough regions. While, prior to alteration, the material forming the punchthrough region was semiconductive, after alteration, the material has become insulative by altering its physical properties.

The method commences at step 102, wherein an insulative punchthrough region is formed by implanting oxygen or another suitable material, such as nitrous for example, into the surface of a substrate. Once the insulative punchthrough region is formed, active regions of the substrate surface are masked at step 104. Then, the areas of the substrate surface unprotected by the mask are etched to form isolation regions within the substrate at step 106. The isolation regions that were formed at step 106 are then filled with an insulative material at step 108 to form isolation regions that will serve to isolate the active components of the completed integrated circuit.

Next, at step 110, the substrate is doped to form well regions where required. Then, at step 112, a gate oxide layer is formed where it is required. The channel regions are then doped to set $V_T$ at a design level at step 114. Alternatively, steps 112 and 114 could be performed in an opposite order with respect to one another. Next, the gate conductors are formed at step 1 16 and the lightly doped regions and spacers are formed at step 118. As a final step in the formation of the transistors, the source and drain regions are doped at step 120.

Then, the transistors (and other components that have been formed) are coupled at step 122 to form the integrated circuit. The coupling of the devices is generally known to include forming vias from the devices to at least one metallization layer, forming conductor paths in the metallization layer and intercoupling the devices with the vias and conductor paths. Additional metallization layers may be required for interconnection purposes, the additional metallization layers separated from the first metallization layer by a suitable insulative layer and intercoupled with conductive vias. Integrated circuits that may be constructed according to the present invention include microprocessors, microcontrollers, digital signal processors, signal conversion circuitry, application specific integrated circuits and microprocessor companion chip sets, for example.

Figure 2A:
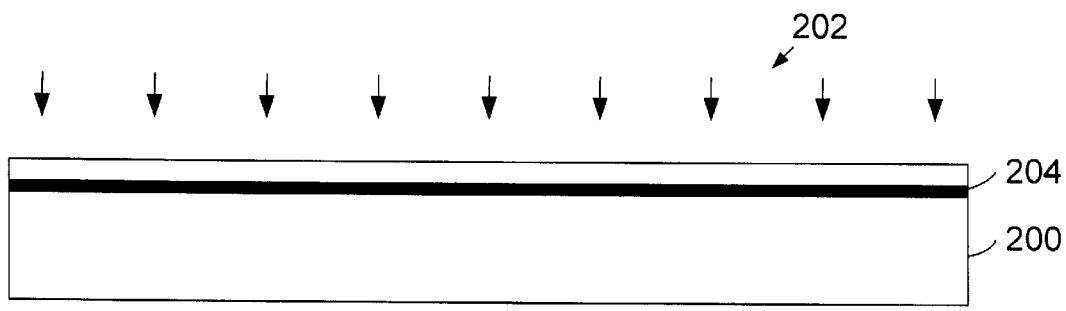
FIGS. 2A through 2D are partial cross-sectional views of a semiconductor substrate during formation of transistors according to the method of FIG. 1.

FIG. 2A illustrates a partial cross-sectional view of a semiconductor substrate 200 consistent with the execution of step 102 of FIG. 1. Substrate 200 is a silicon-based, single crystalline material doped either n-type or p-type in the described embodiment. Oxygen ions are implanted into the substrate 200 to form an insulative punchthrough region uniformly across the substrate 200 using an ion implant process (implantation referred as numeral 202). The ion implant process applies the oxygen ions at an implant energy of 50 to 500 keV and a dose of $5 \times 10^{13}$ to $5 \times 10^{15}$ ions/cm$^2$.

Figure 2B:
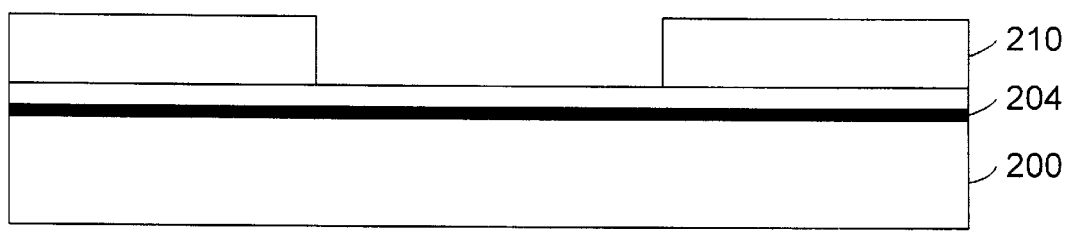

FIG. 2B illustrates the substrate 200 after it has been selectively masked with a photoresist mask 210 to expose areas that will become isolation areas. Thus, the execution of step 104 of FIG. 1 has been applied to the substrate 200 so that the active regions have been masked and the intended isolation regions have been exposed. The photoresist mask 210 employed is chosen such that it will resist the subsequent etching step.

Figure 2C:
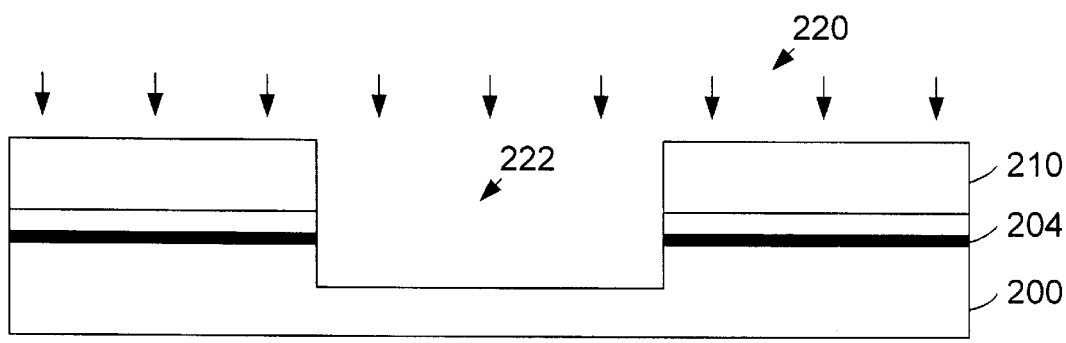

FIG. 2C illustrates the substrate 200 after the substrate has been etched to form isolation region openings 222 according to step 106 of FIG. 1. Such etching may be performed using an anisotropic dry etch process (depicted as numeral 220) that etches away exposed portions of the substrate 200 to form the isolation region openings 222. Because the etching process is required to etch through the silicon portion of the substrate 200, as well as the insulative punchthrough region 204 formed in the substrate, multiple selective etch processes may be required to create the isolation region openings 222.

Figure 2D:
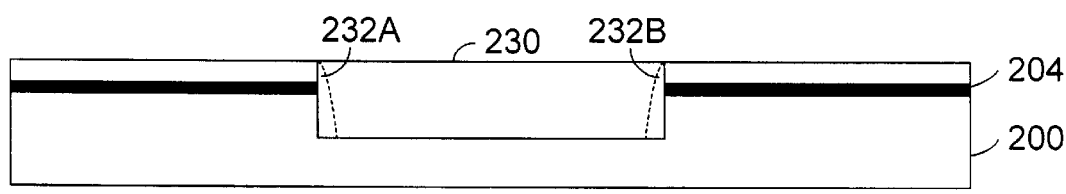

FIG. 2D illustrates the substrate 200 after the photoresist mask 210 has been stripped and the isolation region openings 222 have been filled with an insulative material to form the isolation regions 230 according to step 108 of FIG. 1. In one embodiment, the isolation region openings 222 are filled with an oxide using a chemical vapor deposition ("CVD") step in a TEOS process. Alternately, the isolation regions 230 may be grown in a thermal growth process to form an oxide. In such thermal growth process, the exposed isolation region openings 222 are exposed to an oxidizing ambient according to the well known LOCOS process.

Once the isolation region openings 222 are filed with a deposited or grown oxide, the surface of the substrate 200 is planarized. According to one embodiment, the uneven surface created in the CVD step is planarized by chemical mechanical polishing ("CMP"). CMP utilizes a slurry material and a polishing pad placed on the exposed surface, whereby the pad rotates and removes the upper surfaces so as to form the planar upper surface in which the upper surface of the isolation regions 230 reside in a common plane with an upper surface of the exposed silicon of the substrate 200. After formation and planarization, the isolation regions 230 have a thickness of approximately 3,000 to 4,000 Angstroms.

A potential exists, that uneven sidewalls will be formed in the isolation region openings 222 during the etch process. Accordingly, in one embodiment, liner oxide regions 232A and 232B are formed on the sidewalls of the isolation region prior to depositing or growing the oxide within the isolation region openings 222. The liner oxide regions 232A and 232B may be grown in a thermal process within an oxygen atmosphere. After the liner oxide regions 232A and 232B are formed, the isolation region openings 222 are filled to complete the formation of the isolation regions 230.

Figure 3A:
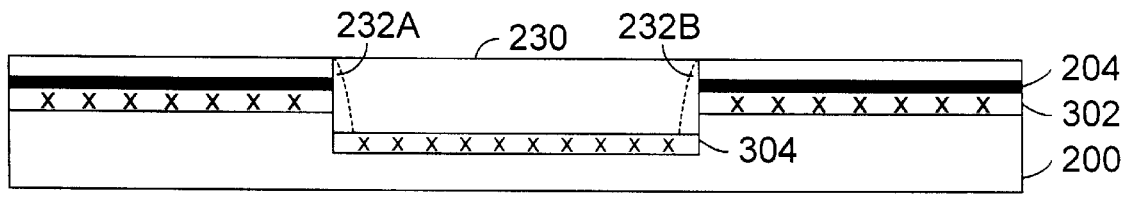
FIGS. 3A through 3D are further partial cross-sectional views of the semiconductor substrate during formation of transistors having insulative punchthrough according to the method of FIG. 1 subsequent to the construction of FIG. 2D.

FIG. 3A illustrates the substrate 200 after wells 302 have been formed within the substrate 200 consistent with step 110 of FIG. 1 using an ion implant process. In one embodiment, a photoresist mask is applied to the substrate 200 surface to mask those regions within which the wells 302 will not be formed. When the substrate 200 is n-type. for example, p-type wells 302 are formed so that n-type transistors may be formed in the p-tipe wells. Conversely, when the substrate 200 is p-type, n-type wells 302 are formed so that p-type transistors may be formed in the n-type wells.

For the formation of a p-type wells in an-type substrate 200, an ion implant step using boron ions is employed. This ion implant step provides an implant energy of 100 keV to 300 keV and a dose of $2 \times 10^{13}$ ions/cm$^2$ to $8 \times 10^{13}$ ions/cm$^2$. In the ion implant step, some ions pass through the isolation region 230 to form portions of the well 304 below the isolation region 230.

Figure 3B:
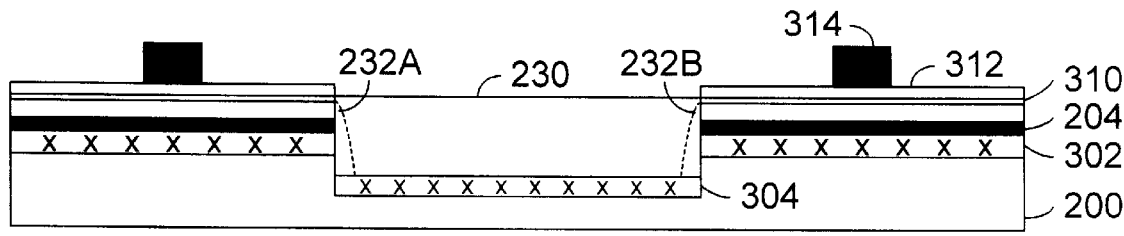

FIG. 3B illustrates the substrate 200 after a gate oxide layer 312 has been formed according to step 112 of FIG. 1, a $V_T$ region 310 has been formed according to step 114 of FIG. 1, and gate conductors 314 been formed according to step 116 of FIG. 1. As shown, a gate oxide layer 312 has been formed upon active regions of the substrate 200. In one embodiment, the gate oxide layer 312 is formed by masking the substrate 200 to allow only desired portions of active regions to be exposed. Then, the gate oxide layer 312 is grown in an oxide growth process. Alternatively, the gate oxide layer 312 may be deposited in a CVD process.

After the gate oxide layer 312 has been formed, the $V_T$ region 310 is formed using an ion implant process. In one embodiment, the ion implant process exposes the unprotected portions of the substrate 200 surface to appropriately charged ions at an energy level of 5 keV to 30 keV with a dose of $2 \times 10^{13}$ ions/cm$^2$ to $8 \times 10^{13}$ ions/cm$^2$. It is understood, of course, that differing process steps are required for forming the $V_T$ regions in n-channel and p-channel regions since differing types of ions are required.

Subsequently, the gate conductors 314 are formed on the substrate 200. The gate conductors 314 may be formed of polysilicon in a series of process steps. In a first step, polysilicon is deposited uniformly across the surface of the substrate in a CVD process. Then, the uniform polysilicon layer is masked and etched so that only the gate conductors 314 remain. Subsequently, the mask used in forming the gate conductors is stripped to reveal the gate conductors 314 structures illustrated.

Figure 3C:
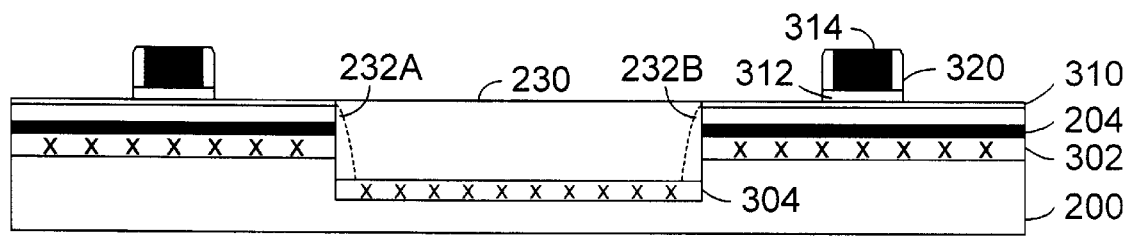

FIG. 3C illustrates the substrate 200 after spacers 320 have been formed according to step 118 of FIG. 1 and after the oxide layer 312 has been etched so that only portions of the gate oxide layer 312 residing below the spacers 320 and the gate conductors 314 remain. In forming the spacers, a CVD oxide is deposited across the surface of the substrate 200 and the oxide is then removed using an anisotropic etch. Resulting from the anisotropic etch, the oxide spacers 320 are left on opposing sidewall surfaces of the gate conductors 312.

Figure 3D:
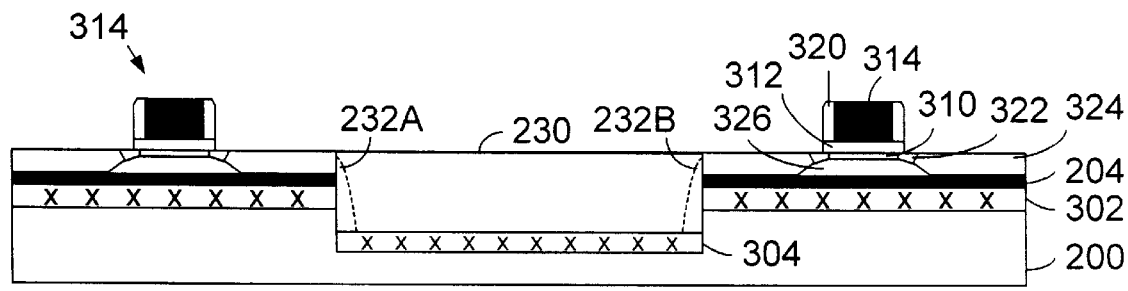

FIG. 3D illustrates the substrate 200 after an Ldd has been formed according to step 118 of FIG. 1 and the source/drain regions 324 have been formed according to step 120 of FIG. 1. In forming the Ldd 322, a light doping is applied to the active regions. Thereafter, the substrate 200 is selectively doped to form the source/drain regions 324. As with other steps in the process, multiple steps are required in the selective doping to properly dope the n-type and p-type transistors. The doping process employed in each step is based upon the type of transistor doped, e.g. n-channel or p-channel.

Once the structure illustrated in FIG. 3D is complete, the active devices formed in the substrate 200 are complete and ready to be connected. As was previously discussed at step 122 of FIG. 1, the active devices may be coupled according to known techniques. Additional devices, such as capacitors, may also be formed in the substrate 200 and intercoupled with the active devices to form an integrated circuit. Upon interconnection, external connections are also established so that the integrated circuit may be used.

Figure 4:
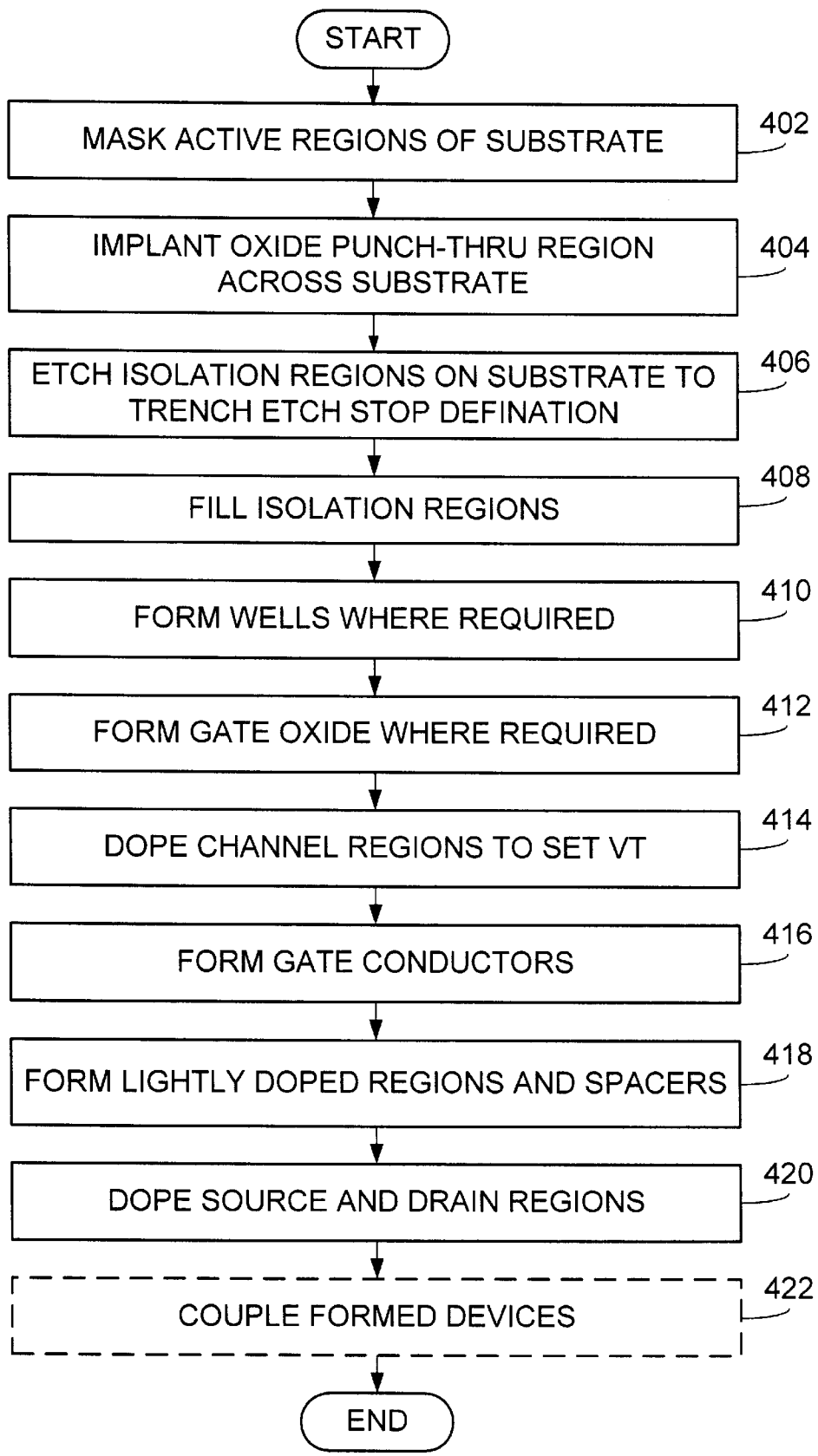
FIG. 4 is a logic diagram illustrating an alternative embodiment of a method for making an integrated circuit having a plurality of transistors with insulative punchthrough regions in which the implant step which forms the insulative punchthrough region also forms an etch stop in isolation regions.

FIG. 4 illustrates an alternate method for forming an integrated circuit according to the present invention. The method of FIG. 4 includes forming a plurality of transistors having insulative punchthrough regions. As compared to the method described with reference to FIG. 1, the method disclosed with reference to FIG. 4 forms the insulative punchthrough regions in active regions of the substrate and, concurrently, forms an etch stop in isolation regions of the substrate. The method described with reference to FIG. 4 will be subsequently described in detail as applied to the formation of transistors and an integrated circuit with particular reference to FIGS. 5A through 5D and 6A through 6D.

The method commences at step 402, wherein active regions of the substrate are masked while isolation regions of the substrate are left exposed. Then, at step 404, an insulative punchthrough region is formed by implanting oxygen or another suitable material into the surface of the substrate. In the active regions that have been masked, the oxygen implant step forms the insulative punchthrough region. However, in the exposed isolation regions, the oxygen implant step forms an implant region at a relatively deeper level within the substrate, the implanted region producing an trench etch stop defination.

Next, at step 406, the exposed isolation regions of the substrate are etched until the etching reaches the trench etch stop defination. Then, the mask is removed and the isolation regions that were opened at step 406 are filled with an insulative material at step 408 to form the isolation regions that will serve to isolate the active components of the completed integrated circuit. Next, at step 410, the substrate is doped to form well regions where required.

The gate oxide is formed at step 412 according to design. The channel regions are then doped to set $V_T$ at a design level at step 414. Alternatively, steps 412 and 414 could be performed in an opposite order with respect to one another. Next, the gate conductors are formed at step 416 and lightly doped regions and spacers are formed at step 418. As a final step in the formation of the transistors, the source and drain regions are doped at step 420. Then, the transistors (and other components that have been formed) are coupled at step 422 to form the integrated circuit. The coupling of the devices is generally known to include forming vias from the devices to at least one metallization layer, forming conductor paths in the metallization layer and intercoupling the devices with the vias and conductor paths. Additional metallization layers may be required for interconnection purposes, the additional metallization layers separated from the first metallization layer by a suitable insulative layer and intercoupled with conductive vias.

Figure 5A:
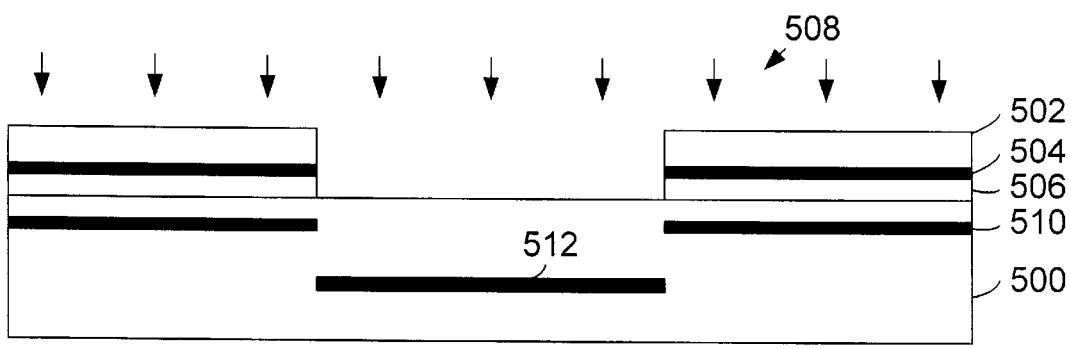
FIGS. 5A through 5D are partial cross-sectional views of a semiconductor substrate during formation of transistors having insulative punchthrough regions according to the method of FIG. 4.

FIG. 5A illustrates a partial cross-sectional view of a semiconductor substrate 500 consistent with the execution of steps 402 and 404 of FIG. 4. As shown, the substrate 500, which is a silicon-based, single crystalline material doped either n-type or p-type in the described embodiment, has been masked with a multiple layer mask to expose isolation regions. A sandwich mask has been selectively formed to control implant depths during the ion implant process. The sandwich mask includes an oxide layer 506, a nitride layer 504 and a photoresist layer 502. Oxygen ions are implanted into the substrate 500 an ion implant process (referenced at numeral 508) are to form an insulative punchthrough region 510 across the active regions of the substrate 500. Concurrently, the ion implant process forms an etch stop defination 512 across the isolation regions of the substrate 500. The ion implant process employs an implant energy of 50 to 500 keV and a dose of $5 \times 10^{13}$ to $5 \times 10^{15}$ ions/cm$^2$.

Figure 5B:
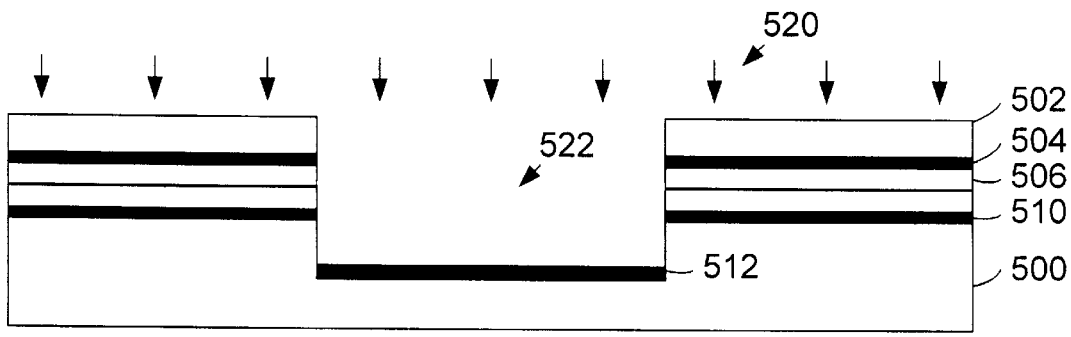

FIG. 5B illustrates the substrate 500 after the substrate has been etched to form isolation region openings 522 according to step 406 of FIG. 4. Such etching may be performed using an anisotropic dry etch step (referenced as numeral 520) that etches away exposed portions of the substrate 500 unprotected by the mask to form isolation region openings 522 until the etch stop defination 512 is reached.

Figure 5C:
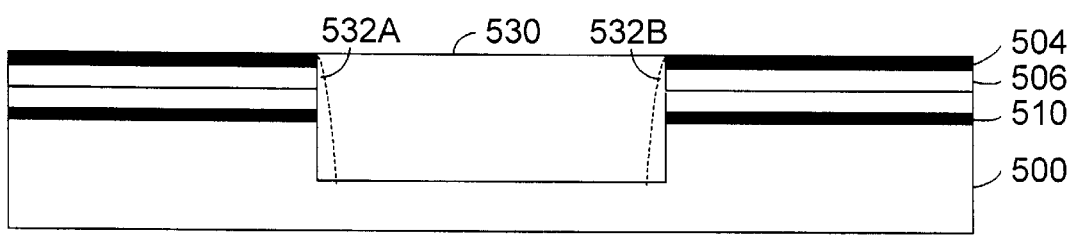
Figure 5D:
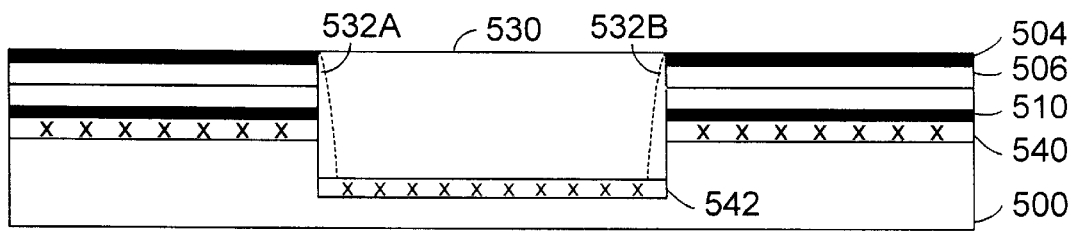

FIG. 5C illustrates the substrate 500 after the photoresist mask 502 has been stripped and the isolation region openings 522 have been filled with an insulative material to form the isolation regions 530 according to step 408 of FIG. 4. Because the etch stop defination 512 is also formed of an insulative material, it melds with the insulative material and is not separately depicted in FIG. 5C. Liner oxide regions 532A and 532B may also be formed on the sidewalls of the isolation regions prior to depositing or growing the oxide within the isolation region openings 522. FIG. 5D illustrates the substrate 200 after formation of wells 540 according to step 410 of FIG. 1. As shown, in forming the wells portions of the well 540 reside below active regions and portions of the well 542 also reside below the isolation regions 530.

Figure 6A:
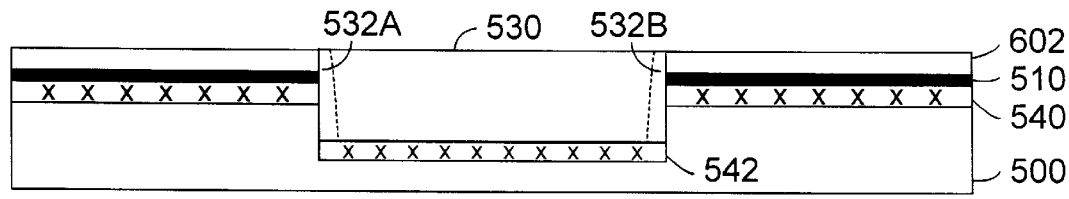
FIGS. 6A through 6D are further partial cross-sectional views of the semiconductor substrate during formation of transistors having insulative punchthrough according to the method of FIG. 4 subsequent to the construction of FIG. 5D.
Figure 6B:
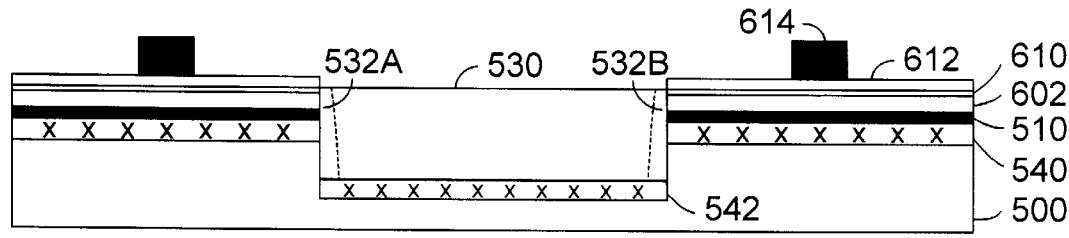

FIG. 6A illustrates the substrate 500 after the substrate has been planarized to expose a top layer 602 of the substrate 500. FIG. 6B illustrates the substrate 500 after a gate oxide layer 612 has been formed according to step 412 of FIG. 4, a $V_T$ region 610 has been formed according to step 414 of FIG. 4, and gate conductors 614 been formed according to step 416 of FIG. 4.

Figure 6C:
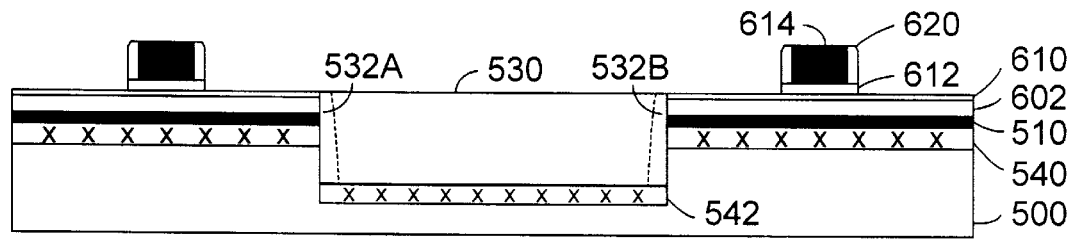

FIG. 6C illustrates the substrate 500 after completion of step 418 of FIG. 4 in which spacers 620 are formed about the gate conductors 614 and the gate oxide layer 612 has been removed, except for those portions of the gate oxide layer 612 residing below the gate conductors 614.

Figure 6D:
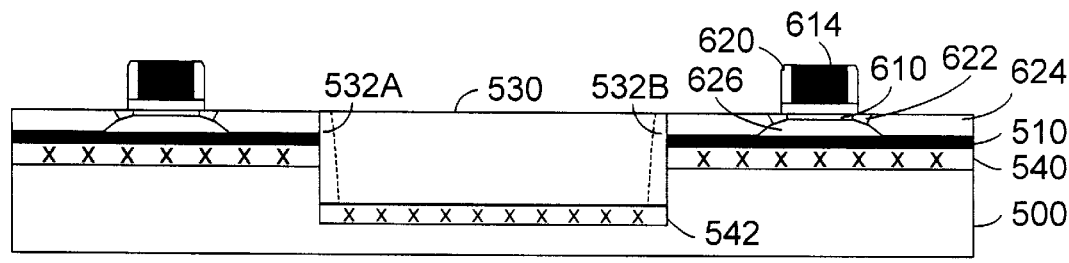

FIG. 6D illustrates the substrate 500 after the Ldds 622 have been formed according to step 420 of FIG. 4 and after the source/drain regions 624 have been doped according to step 420 of FIG. 4. Once the structure illustrated in FIG. 6D is complete, the active devices formed in the substrate 500 are ready to be connected. As was previously discussed at step 422 of FIG. 4, the active devices may be coupled according to known techniques.

Figure 7:
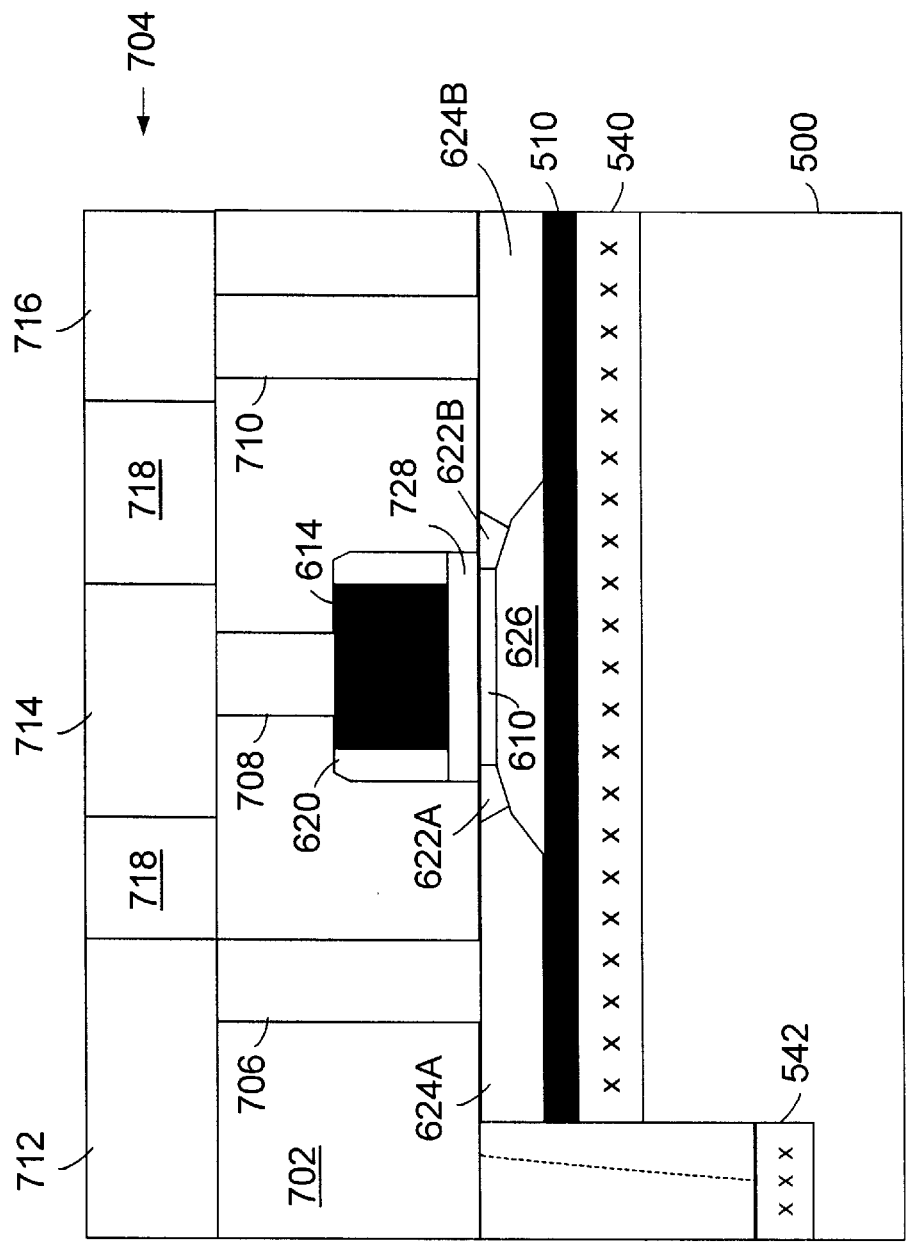
FIG. 7 is a partial cross sectional diagram of a transistor that has been formed according to the present invention, showing in detail the components of the transistor and illustrating how the transistor will be connected to other transistors to form an integrated circuit.

FIG. 7 illustrates a device formed according to the present invention including interconnection paths that allow the device to be connected to other devices as well as to external connections. As shown, the insulative punchthrough region 510 isolates the source 624A, channel 626 and drain 624B from the well 540 (or substrate if no well is present). Because of this isolation, the channel 626 maintains its depth so that the device will provide sufficient drain 624B to source 624A current ($I_{DS}$) when turned on. Further, because the insulative punchthrough region 510 is formed of a suitable insulative material, the $V_T$ region 610 is not compromised by the presence of the insulative punchthrough region 510. Thus, design voltage turn-on levels are met within tolerances, even with process steps vary to levels that would alter voltage turn-on levels beyond design boundaries using conventional punchthrough regions.

An insulator layer 702 isolates the device from a first metallization layer 704. Such insulator layer 702, in one embodiment, is formed in a CVD process at a thickness that is required to isolate the first metallization layer 704 from the device and other devices. The insulator layer 702 is polished in a CMP process to form a planar upper surface. Then, the insulator layer 702 is masked and etched to form via openings to the active regions (source 624A, gate conductor 614 and drain 624B of the devices). Once the via openings are formed, a sputtering or evaporation process, for example, is used to fill the vias with a metal to form vias 706, 708 and 710. According to one embodiment, the metal comprises Ti, TiN, W or Al. In this metal deposition process, the metallization layer 704 may also be deposited.

Then, the metallization layer 704 is masked to form a conductor pattern and etched back to the insulator layer 702 to form the conductors 712, 714 and 716. An insulator layer 718 may be formed to isolate conductive paths 712, 714 and 718 formed in the metallization layer 704, particularly if a subsequent metallization layer is formed upon the metallization layer 704. Subsequent metallization layers (not shown) would provide further interconnections among the devices and external to the formed integrated circuit.

While the invention is susceptible to various modifications and alternative forms, specific embodiments thereof have been shown by way of example in the drawings and detailed description. It should be understood, however, that the drawings and detailed description thereto are not intended to limit the invention to the particular form disclosed, but on the contrary, the invention is to cover all modifications, equivalents and alternatives falling within the spirit and scope of the present invention as defined by the claims.

We claim:

1. A transistor formed on a semiconductor substrate, comprising:
    an active region;
    a trench isolation region surrounding the active region the trench isolation region comprising a trench filled with a dielectric, the trench having a substantially flat bottom and substantially vertical sidewalls;
    a channel formed in a top portion of the active region;
    a source formed in a top portion of the active region and residing adjacent a first end of the channel;
    a drain formed in a top portion of the active region and residing adjacent a second end of the channel;
    an implanted insulative layer formed in the semiconductor substrate;
    wherein a first portion of the implanted insulative layer resides below the channel, the source and the drain to form an insulative punchthrough layer that extends fully across the active region;
    wherein a second portion of the implanted insulative layer resides below the filled dielectric of the trench isolation region and extends fully across the bottom of the trench;
    wherein the implanted insulative layer resides at a first depth in the substrate across the trench isolation region and at a second depth in the substrate across the active region, wherein the first depth is greater than the second depth;
    a gate oxide formed above the channel; and
    a gate conductor formed above the gate oxide.

2. The transistor of claim 1, wherein the implanted insulative layer has a thickness and wherein the difference between the second depth and the first depth is greater than the thickness of the implanted insulative layer such that the first portion of the implanted insulative layer does not contact the second portion of the implanted insulative layer.

3. The transistor of claim 1, further comprising a voltage threshold region formed between the gate oxide and the channel.

4. The transistor of claim 1, further comprising insulative spacers formed about the gate conductor.

5. The transistor of claim 1, further comprising lightly doped regions formed adjacent the channel.

6. The transistor of claim 1, wherein the implanted insulative layer comprises an oxide layer formed within the substrate.

7. The transistor of claim 1, wherein the implanted insulative layer comprises Silicon Dioxide that has been formed within the substrate.

8. The transistor of claim 1, further comprising liner oxide regions formed on the sidewalls of the trench.

9. An integrated circuit formed in a semiconductor substrate comprising:
    a plurality of transistors, each transistor comprising:
        an active region;
        a trench isolation region surrounding, the active region, the trench isolation region comprising a trench filled with a dielectric, the trench having a substantially flat bottom and substantially vertical sidewalls;
        a channel formed in a top portion of the active region;
        a source formed in a top portion of the active region and residing adjacent a first end of the channel;
        a drain formed in a top portion of the active region and residing adjacent a second end of the channel;
        an implanted insulative layer formed in the semiconductor substrate;
        wherein a first portion of the implanted insulative layer resides below the channel, the source and the drain to form an insulative punchthrough layer that extends fully across the active region;
        wherein a second portion of the implanted insulative layer resides below the filled dielectric of the trench isolation region and extends fully across the bottom of the trench;
        wherein the implanted insulative layer resides at a first depth in the substrate across the trench isolation region and at a second depth in the substrate across the active region, wherein the first depth is greater than the second depth;
        a gate oxide formed above the channel; and
        a gate conductor formed above the gate oxide; and
    a plurality of interconnections coupling the plurality of transistors to one another to form the integrated circuit.

10. The integrated circuit of claim 9, wherein the implanted insulative layer has a thickness and wherein the difference between the second depth and the first depth is greater than the thickness of the implanted insulative layer such that the first portion of the implanted insulative layer does not contact the second portion of the implanted insulative layer.

11. The integrated circuit of claim 9, wherein each transistor further comprises a voltage threshold region disposed between the gate oxide and the channel.

12. The integrated circuit of claim 9, wherein each transistor further comprises insulative spacers formed about the gate conductor.

13. The integrated circuit of claim 9, wherein each transistor further comprises lightly doped regions formed adjacent the channel.

14. The integrated circuit of claim 9, wherein the implanted insulative layer comprises an oxide layer formed within the substrate.

15. The integrated circuit of claim 9, wherein the implanted insulative layer comprises Silicon Dioxide that has been formed within the substrate.

16. The integrated circuit of claim 9, wherein at least one of the plurality of transistors further comprises liner oxide regions formed on the sidewalls of the trench.

* * * * *